(12) United States Patent
Kim et al.

(10) Patent No.: US 10,714,550 B2
(45) Date of Patent: Jul. 14, 2020

(54) ORGANIC LIGHT-EMITTING DISPLAY APPARATUS HAVING PROTECTED EMISSION LAYER

(71) Applicant: SAMSUNG DISPLAY CO., LTD., Yongin-si, Gyeonggi-Do (KR)

(72) Inventors: Deukjong Kim, Yongin-si (KR); Donghyun Lee, Yongin-si (KR); Sangki Kim, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/404,464

(22) Filed: May 6, 2019

(65) Prior Publication Data
US 2019/0259820 A1 Aug. 22, 2019

Related U.S. Application Data

(62) Division of application No. 15/468,991, filed on Mar. 24, 2017, now Pat. No. 10,312,305.

(30) Foreign Application Priority Data

Mar. 24, 2016 (KR) .................. 10-2016-0035546

(51) Int. Cl.
*H01L 27/32* (2006.01)
*H01L 51/52* (2006.01)

(52) U.S. Cl.
CPC ...... *H01L 27/3246* (2013.01); *H01L 27/3262* (2013.01); *H01L 27/3276* (2013.01);
(Continued)

(58) Field of Classification Search
CPC ............ H01L 27/3246; H01L 51/5237; H01L 51/5203; H01L 27/3262; H01L 27/3276;
(Continued)

(56) References Cited

U.S. PATENT DOCUMENTS

| 9,000,428 B2* | 4/2015 | Lee .................. H01L 27/3272 257/40 |
| 2013/0009162 A1* | 1/2013 | Kang ................ H01L 27/3246 257/72 |

(Continued)

FOREIGN PATENT DOCUMENTS

| KR | 10-2013-0107116 | 10/2013 |
| KR | 10-2014-0133053 | 11/2014 |

(Continued)

*Primary Examiner* — Yasser A Abdelaziez
(74) *Attorney, Agent, or Firm* — F.Chau & Associates, LLC (57) ABSTRACT

An organic light-emitting display apparatus prevents the quality of an image being displayed thereon from being deteriorated as a result of contamination of an organic emission layer. The display apparatus includes a substrate with a display area and a periphery area. A first insulating layer, disposed over the substrate, has a first opening in the periphery area. A first electrode is disposed within the display area, over the first insulating layer. A first bank is disposed over the first insulating layer and has a second opening through which a center of the first electrode is exposed. A second bank is disposed over the first insulating layer and is separated from the first bank. The first opening is disposed between the first bank and the second bank. An intermediate layer is disposed over the first electrode. A second electrode is disposed over the intermediate layer and the first bank.

7 Claims, 7 Drawing Sheets

(52) U.S. Cl.
CPC ...... *H01L 51/5203* (2013.01); *H01L 51/5237* (2013.01); *H01L 51/5246* (2013.01); *H01L 51/5253* (2013.01)

(58) Field of Classification Search
CPC ............. H01L 51/5253; H01L 51/5246; H01L 27/3244
See application file for complete search history.

(56) References Cited

U.S. PATENT DOCUMENTS

| | | |
|---|---|---|
| 2013/0248826 A1 | 9/2013 | Kim et al. |
| 2015/0034921 A1 | 2/2015 | Kim |
| 2015/0041772 A1 | 2/2015 | Han |
| 2015/0115256 A1 | 4/2015 | You |
| 2015/0228927 A1* | 8/2015 | Kim .................. H01L 51/5203 257/40 |
| 2016/0013253 A1 | 1/2016 | Lee |
| 2017/0117502 A1* | 4/2017 | Park .................... H01L 27/3258 |
| 2017/0278912 A1 | 9/2017 | Kim et al. |
| 2017/0287394 A1 | 10/2017 | Kim et al. |
| 2017/0345881 A1 | 11/2017 | Kim et al. |

FOREIGN PATENT DOCUMENTS

| | | |
|---|---|---|
| KR | 10-2015-0094950 | 8/2015 |
| KR | 10-2016-0007968 | 1/2016 |

\* cited by examiner

ORGANIC LIGHT-EMITTING DISPLAY APPARATUS HAVING PROTECTED EMISSION LAYER

CROSS-REFERENCE TO RELATED APPLICATION

This application is a Division of co-pending U.S. patent application Ser. No. 15/468,991, filed on Mar. 24, 2017, which claims priority to, and the benefit of Korean Patent Application No. 10-2016-0035546, filed on Mar. 24, 2016, in the Korean intellectual Property Office, the disclosures of which are incorporated by reference herein in their entirety.

TECHNICAL FIELD

One or more embodiments relate to an organic light-emitting display apparatus, and more particularly, to an organic light-emitting display apparatus that may prevent impurities from contaminating an emission layer thereof.

DISCUSSION OF THE RELATED ART

An organic light-emitting display apparatus includes an organic light-emitting device (OLED). An OLED includes a hole injection electrode, an electron injection electrode, and organic emission layer that is disposed between the hole injection electrode and the electron injection electrode. The electron injection electrode delivers electrons to the organic emission layer while the hole injection electrode delivers holes to the organic emission layer. As the holes and electrons combine within the organic emission layer, excitons are formed. As the excited state of the exciton decays, the energy levels of the electrons relax and photons are emitted. In this way, the OLED is capable of producing light and so OLED displays are able to be self-emission display apparatus that do not require the use of a backlight unit in order to display an image.

Because the organic light-emitting display apparatus is self-emissive, it can be driven with a low voltage and can be configured to have a light weight and a small size, as compared to display devices that require the use of backlights. Also, because the organic light-emitting display apparatus has a wide viewing angle, high contrast, and a fast response speed, this display technology is a popular choice various types of electronic devices, such as portable media players, mobile phones, and televisions.

Research into making flexible OLED display apparatuses, such as foldable OLED display apparatuses or rollable OLED display apparatuses has been carried out.

However, organic light-emitting display apparatuses, according to the related art, have a problem in that impurities, such as gas or moisture, may be introduced from the outside or may be generated in the organic material included in the display apparatus. These impurities may then penetrate into the OLED, either during manufacturing or in use. Penetration of impurities into the MED may then causes deterioration of the quality of an image that is displayed on the OLED display.

SUMMARY

The or more exemplary embodiments of the present invention include an organic light-emitting display apparatus having a structure in which the quality of an image to be formed may be prevented from being deteriorated or deterioration may be reduced.

According to one or more exemplary embodiments of the present invention, an organic light-emitting display apparatus includes a substrate having a display area and a periphery area that is outside of the display area. A first insulating layer is disposed within both the display area and the periphery area. The first insulating layer is disposed over the substrate area and has a first opening in the periphery area. A first electrode is disposed within the display area and over the first insulating layer. A first bank is disposed over the first insulating layer in both the display area and the periphery area. The first bank has a second opening through which a center of the first electrode is exposed. A second bank is disposed over the first insulating layer and is separated from the first bank. The first opening is disposed between the first bank and the second bank. An intermediate layer is disposed over the first electrode. A second electrode is disposed over the intermediate layer and the first bank.

Each of a distance from an edge of the fast bank facing the second bank to the first opening and a distance from an edge of the second bank facing the first bank to the first opening may be about 4 μm or more.

A distance between the first bank and the second bank may be about 15 μm or more.

The second electrode might not be disposed in the first opening and might not be disposed over the second bank.

The organic light-emitting display apparatus may further include a conductive layer disposed within the periphery area over the first insulating layer and disposed to cover the first opening.

The first bank may include a plurality of areas, each separated from one another so that at least a part of the conductive layer is exposed.

The second electrode may contact the conductive layer between the plurality of areas.

The conductive layer ay include a plurality of third openings disposed within a periphery of the first opening.

The organic light-emitting display apparatus may further include a second insulating layer disposed under the first insulating layer and including an inorganic material. At least a part of the second insulating layer may be exposed through the first opening.

The organic light-emitting display apparatus may further include a capping layer disposed over the second electrode in the display area and the periphery area.

At least a part of the second electrode may be exposed by the capping layer.

Each of the first insulating layer, the first and second banks, and the capping layer may include an organic material.

The organic light-emitting display apparatus may further include an encapsulation layer. The encapsulation layer may include at least one inorganic layer and at least one inorganic layer, each disposed over the capping layer.

The first opening may encompass the display area.

The first insulating layer may include a first area and a second area separated from each other by the first opening.

The first opening may include a main opening and a plurality of branched openings branched from the main opening.

The display area may include four corners and four edges connecting the four corners.

The main opening may be located adjacent to each of the four corners, and the plurality of branched openings may be located in at least two of the four edges.

The main opening may be branched into at least three branched openings, and the at least three branched openings may be located in at least one of the four edges.

The first insulating layer may further include a third area surrounded by the branched openings.

The organic light-emitting display apparatus may further include a conductive layer in the first area, the second area, and the third area over the first insulating layer. The conductive layer may have a plurality of third openings located in each of the second area and the third area.

An organic light-emitting display apparatus includes a substrate including a display area in a center thereof and a non-display area surrounding the display area. A first bank is disposed on the substrate. The first bank includes an OLED and a plurality of openings that correspond to a plurality of sub-pixels. A second bank is separated from the first bank and is disposed entirely within the non-display area. An insulating layer covers the first bank and the second bank. The insulating layer has an opening disposed between the first bank and the second bank such that the opening separates the first bank from the second bank.

The first bank and the same bank may each include a same organic material as the insulating layer. The organic light-emitting display apparatus may further include a first electrode disposed within the display area and overlapping the insulation layer therein. A center of the first electrode may be exposed through an opening in the first bank. The organic light-emitting display apparatus may further include an intermediate layer disposed over the first electrode and a second electrode disposed over the intermediate layer and the first bank

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Those components that are the same as or similar to other components may be referred to by the same reference numerals throughout the figures, and redundant explanations of these components may be omitted.

Also, sizes and thicknesses of elements in the drawings may be exaggerated for clarity of illustration and convenience of explanation. Accordingly, exemplary embodiments of the present invention should not be viewed as necessarily being limited to the sizes and thicknesses of the elements, as they appear in the drawings.

Figure 1:
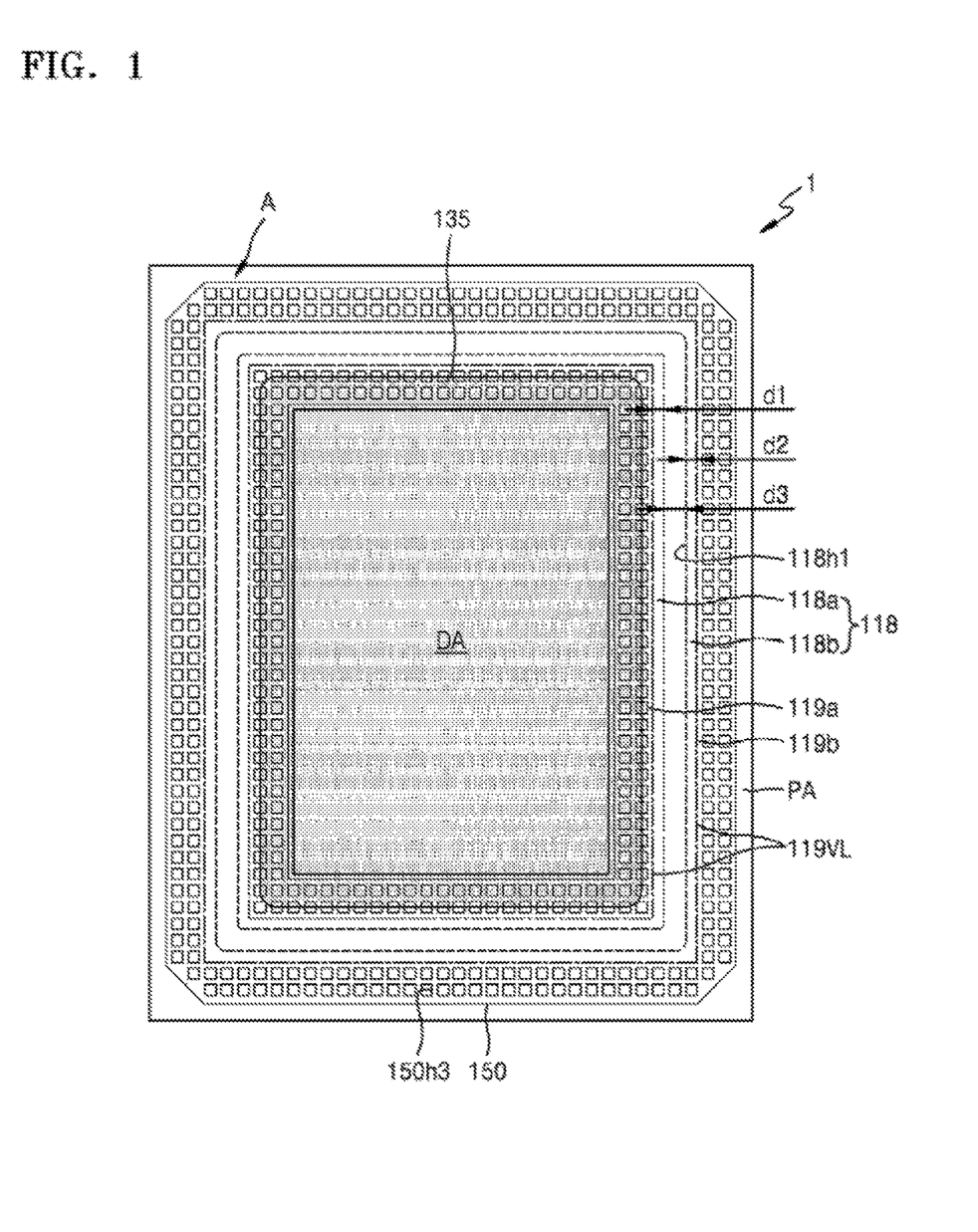
FIG. 1 is a plan view schematically illustrating an organic light-emitting display apparatus according to an exemplary embodiment of the present invention.
Figure 2:
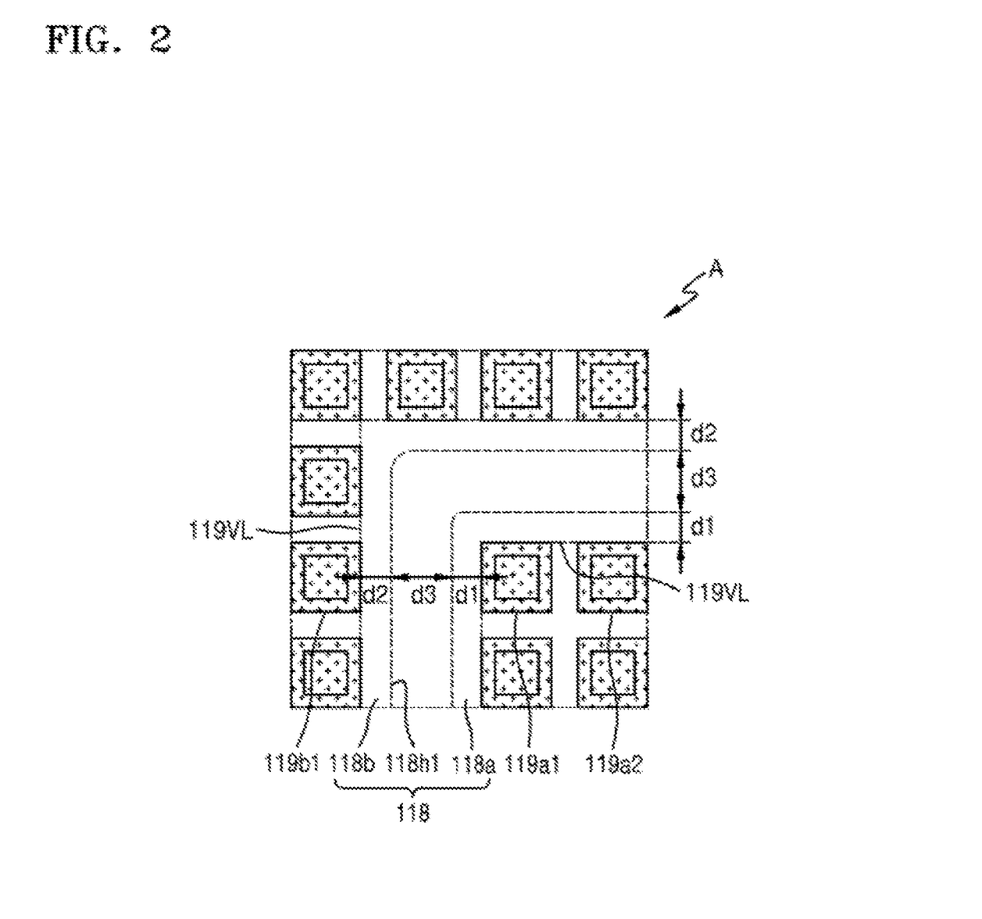
FIG. 2 is a plan view schematically illustrating region A of FIG. 1.
Figure 3:
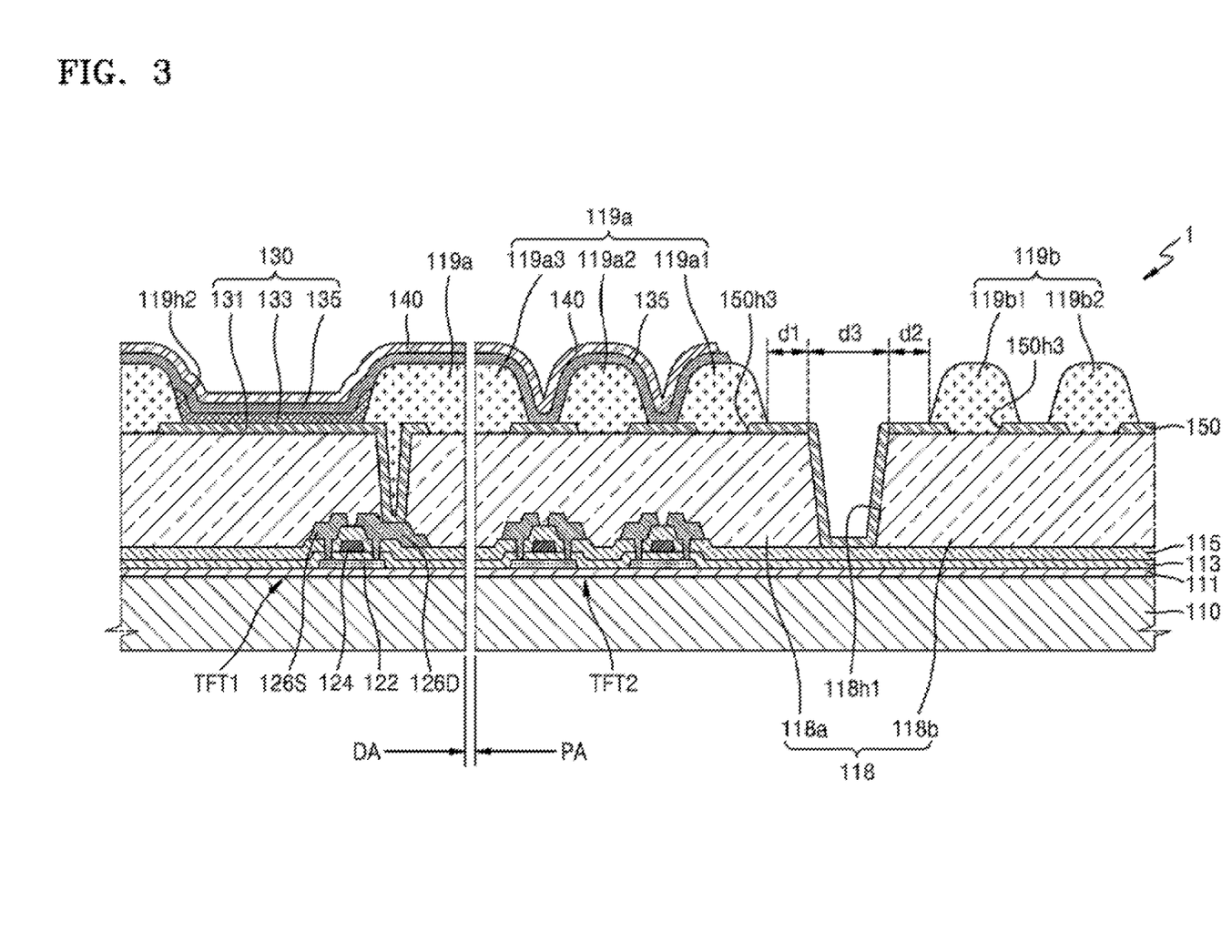
FIG. 3 is a cross-sectional view schematically illustrating a part of the organic light-emitting display apparatus of FIG. 1.
Figure 4:
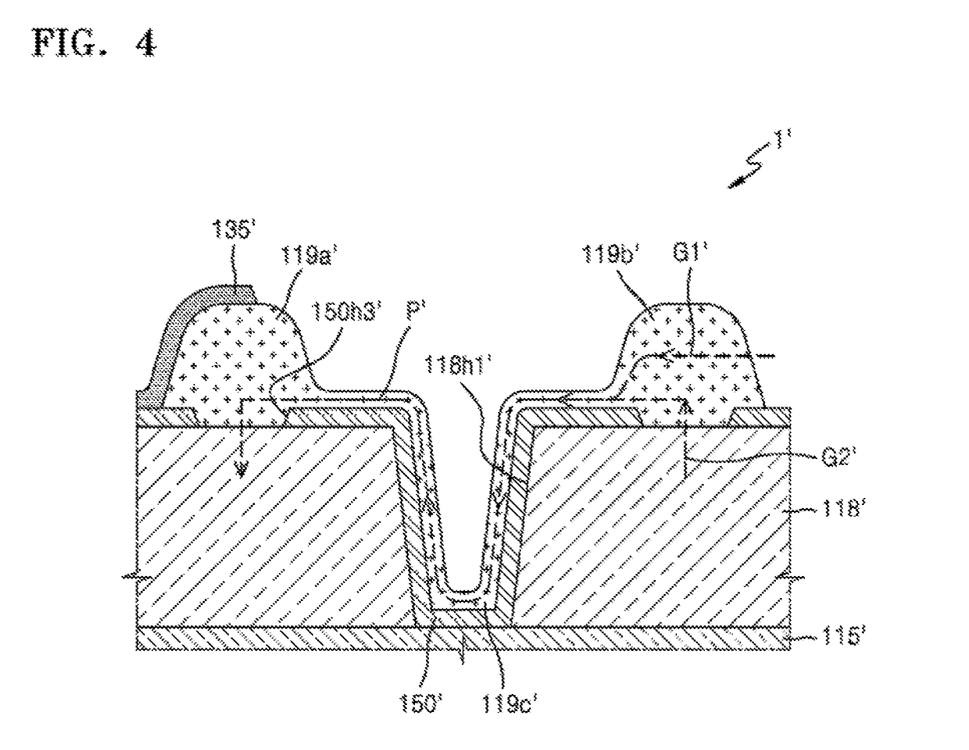
FIG. 4 is a cross-sectional view schematically illustrating a part of an organic light-emitting display apparatus.

FIG. 1 is a plan view schematically illustrating an organic light-emitting display apparatus according to an exemplary embodiment of the present invention. FIG. 2 is an enlarged plan view of region A of FIG. 1. FIG. 3 is a cross-sectional view schematically illustrating a part of the organic light-emitting display apparatus of FIG. 1, FIG. 4 is a cross-sectional view schematically illustrating a part of an organic light-emitting display apparatus according to an example.

Referring to FIGS. 1 through 3, an organic light-emitting display apparatus 1 according to an exemplary embodiment of the present invention includes a substrate 110 having a display area DA and a periphery area PA. The periphery area PA is a non-display area that is disposed outside of the display area DA. The substrate 110 may include various materials such as glass, metal, plastic, and the like. According to an exemplary embodiment of the present invention, the substrate 110 may be a flexible substrate. For example, the substrate 110 may include a polymer resin, such as polyethersulphone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), or cellulose acetate propionate (CAP).

The display area DA of the substrate 110 is an area in which an image is displayed. The display area DA may include a plurality of first thin film transistors TFT1 and organic light-emitting devices (OLEDs) 130, which are electrically connected to the plurality of first thin film transistors TFT1. The OLEDs 130 may be electrically connected to the plurality of first thin film transistors TFT1 by a plurality of first electrodes 131. A plurality of second thin film transistors TFT2 may be disposed in the periphery area PA of the substrate 110. The plurality of second thin film transistors TFT2 may be a part of a circuit unit that is configured, for example, for controlling electrical signals that are applied to the display area DA.

Each of the first thin film transistors TFT1 may include a semiconductor layer 122, a gate electrode 124, a source electrode 126S, and a drain electrode 126D. The semiconductor layer 122 may include amorphous silicon, polycrystalline silicon, or an organic semiconductor material. The gate electrode 124 is disposed above the semiconductor layer 122. The source electrode 126S and the drain electrode 126D are in electrical communication with each other, to an extent that is dictated by signals applied to the gate electrode 124. The gate electrode 124 may have a single layer structure or a multi-layered structure. The gate electrode 124 may include one or more of aluminum (Al), platinum (Pt), palladium (Pd), silver (Ag), magnesium (Mg), gold (Au), nickel (Ni), neodymium (Nd), (Ir), chromium (Cr), lithium (Li), calcium (Ca), molybdenum (Mo), titanium (Ti), tungsten (W), and copper (Cu). The precise composition of the gate electrode 124 may be determined, for example, by taking into account adhesion with an adjacent layer, surface flatness of a layer to be stacked, and processability.

In order to adequately insulate the semiconductor layer 122 from the gate electrode 124, a gate insulating layer 113 may be disposed between the semiconductor layer 122 and the gate electrode 124. The gate insulating layer 113 may include an inorganic material, such as a silicon oxide, a silicon nitride and/or a silicon oxynitride. Furthermore, a second insulating layer 115 may be disposed at a top portion of the gate electrode 124. The source electrode 126S and the drain electrode 126D may each be disposed over the second insulating layer 115. The second insulating layer 115 may include an inorganic material, such as a silicon oxide, a silicon nitride and/or a silicon ox nitride. The source electrode 126S and the drain electrode 126D are electrically connected to the semiconductor layer 122 via contact holes that are formed through both the second insulating layer 115 and the gate insulating layer 113.

The source electrode 126S and the drain electrode 126D may have a single layer structure or a multi-layered structure. The source electrode 126S and the drain electrode 126D may each include Al, Pt, Pd, Ag, Mg, Au, Ni, Nd, Ir, Cr, Li, Ca, Mo, Ti, W, and/or Cu. The precise composition of the source electrode 126S and the gate electrode 126D may be determined, for example, by taking into account conductivity, etc. An insulating layer including the inorganic material may be formed by chemical vapor deposition (CVD) or atomic layer deposition (ALD).

A buffer layer 111 may be disposed between the first thin film transistors TFT1 and the substrate 110. The buffer layer 111 may include an inorganic material, such as a silicon oxide, a silicon nitride and/or a silicon oxynitride. The buffer layer 111 may be used to render a top surface of the substrate 110 more smooth, thereby minimizing or preventing an impurity from the substrate 110, etc. from penetrating into the semiconductor layer 122 of each of the first thin film transistors TFT1.

A first insulating layer 118 may be disposed over each of the first thin film transistors TFT1. For example, when the OLEDs 130 are disposed above the first thin film transistors TFT1, the first insulating layer 118 may have a flat top surface on which a first electrode 131 may be flatly formed. The first insulating layer 118 may be formed of an organic material, such as acryl, benzocyclobutene (BCB), polymide (PI), or hexamethyldisiloxane (HMDSO), for example. In FIG. 3, the first insulating layer 118 has a single layer structure. However, the first insulating layer 118 may alternatively have a multi-layer structure. The first insulating layer 118 may be disposed in the display area DA and the periphery area PA outside the display area DA of the substrate 110. The first insulating layer 118 may have a first opening 118h1 through which the second insulating layer 115 in the periphery area PA is exposed. The first insulating layer 118 may be physically divided into at least two parts by the first opening 118h1. This arrangement of the first insulating layer 118 may prevent an impurity, introduced from the outside, from penetrating into the display area DA through the first insulating layer 118.

In the display area DA of the substrate 110, the OLED 130 is disposed over the first insulating layer 118. The OLED 130 includes the first electrode 131, a second electrode 135, and an intermediate layer 133 disposed between the first electrode 131 and the second electrode 135. The OLED 110 may also include an emission layer.

An opening in the first insulating layer 118 exposes either the source electrode 126S or the drain electrode 126D of each of the first thin film transistors TFT1. The first electrode 131 contacts either the source electrode 126S or the drain electrode 126D through the opening and the first electrode 131 is electrically connected to each of the first thin film transistors TFT1.

The first electrode 131 may be formed as a semitransparent or fully-transparent electrode or as a reflective electrode.

When the first electrode 131 is formed as a semitransparent or fully-transparent electrode, the first electrode 131 may include a transparent conductive layer. The transparent conductive layer may be an indium tin oxide (ITO), an indium zinc oxide (IZO), a zinc oxide (ZnO), an indium oxide ($In_2O_3$), an indium gallium oxide (IGO), and/or an aluminum zinc oxide (AZO). For example, in addition to the transparent conductive layer, the first electrode 131 may further include a semi-transmissive layer for increasing light efficiency. The semi-transmissive layer may be a thin film having a thickness of several to several tens of nm and formed of Ag, Mg, Al, Pt, Pd, Au, Ni, Nd, Ir, Cr, Li, Ca, and/or Yb. When the first electrode 131 is formed as a reflective electrode, the first electrode 131 may include a reflective layer formed of Ag, Mg, Al, Pt, Pd, Au, Ni, Nd, Ir, Cr, and/or a compound thereof. A transparent conductive layer may be disposed at a top portion and/or a bottom portion of the reflective layer. The transparent conductive layer may include an ITO, an IZO, a ZnO, an indium oxide ($In_2O_3$), an IGO, and/or are AZO. However, embodiments of the present invention are not limited thereto, and the first electrode 131 may be formed of various materials, and various modifications are possible where the structure of the first electrode 131 may be a single layer structure or a multi-layered structure.

A first bank 119a may be disposed over the first insulating layer 118 in the display area DA and the periphery area PA. The first bank 119a has an opening that corresponds to sub-pixels. For example, at least a center of the first electrode 131 is exposed through a second opening 119h2. Pixels are thereby defined by the openings. Also, the first bank 119a may increase a distance between an edge of the first electrode 131 and the second electrode 135 above the first electrode 131, thereby preventing arcing, and other related problems, from occurring in the edge of the first electrode 131. The first bank 119a may be formed of an organic material, such as PI or HMDSO. A second bank 119b may be disposed over the first insulating layer 118 and may be separated from the first bank 119a, in the periphery area PA by the first opening 118h1 of the first insulating layer 118, which is located between the first bank 119a and the second bank 119b.

For example, the first bank 119a and the second bank 119b may be completely separated from each other at both sides of the first opening 118h1. Because the first bank 119a and the second bank 119b are completely separated from each other, an impurity, such as gas or moisture, penetrating into the second bank 119b is not introduced into the first bank 119a, regardless of whether the impurity was introduced from the outside or generated within the second bank 119b. Thus, the impurity may be prevented from penetrating into the display area. DA and the quality of an image displayed in the organic light-emitting display apparatus 1 may be prevented from being deteriorated or deterioration may be reduced. The second bank 119b may be formed of the same material as a material for forming the first bank 119a. The first and second banks 119a and 119 may be formed of the same organic material as that of the first insulating layer 118. However, embodiments of the present invention are not limited thereto.

The intermediate layer 133 of the OLED 130 may include a low molecular weight material or a polymer material. When the intermediate layer 133 includes a low molecular weight material, the intermediate layer 133 may have a structure in which a bole injection layer (HIL), a hole transport layer (HTL), an emission layer (EML), an electron transport layer (ETL), and an electron injection layer (EIL)

are stacked on one another. The intermediate layer 133 may include organic materials, such as, copper phthalocyanine (CuPc), N,N'-Di(naphthalene-1-yl)-N,N'-diphenyl-benzidine (NPB), and/or tris-8-hydroxyquinoline aluminum (Alq3). These layers may be formed by a vacuum deposition method. When the intermediate layer 133 includes a polymer material, the intermediate layer 133 may have a structure including an HTL and an EML. In this case, the HTL may include poly 3,4-ethylenedioxythiophene (PEDOT), and the EML may include a poly-phenylenevinylene (PPV)-based polymer material and a polyfluorene-based polymer material. The intermediate layer 133 may be formed by a screen printing or inkjet printing method, a laser induced thermal imaging (LITI) method, or the like.

However, the intermediate layer 133 is not limited thereto and may have various alternative structures. The intermediate layer 133 may include a layer formed integrally with a plurality of first electrodes 131 and/or a patterned layer that corresponds to each of the plurality of first electrodes 131.

The second electrode 135 may be disposed in the display area DA and the periphery area PA. In particular, the second electrode 135 may be disposed at top portions of the intermediate layer 133 and the first bank 119a. For example, the second electrode 135 might not be disposed in the first opening 118h1 or over the second bank 119b. The second electrode 135 may be formed as one body in the plurality of OLEDs 130 and may correspond to the plurality of first electrodes 131.

The second electrode 135 may be formed as a semitransparent or fully transparent electrode or as a reflective electrode. When the second electrode 135 is formed as a semitransparent or fully transparent electrode, the second electrode 135 may include Ag, Al, Mg, Li, Ca, Cu, LiF/Ca, LiF/Al, MgAg, and/or CaAg and may include a thin layer having a thickness of between several nm to several tens of nm. When the second electrode 135 is formed as a reflective electrode, the second electrode 135 may be formed of Ag, Al, Mg, Li, Ca, LiF/Ca, LiF/Al, MgAg, and/or CaAg. However, the composition and material of the second electrode 135 are not limited thereto, and various modifications are possible.

As described above, the first insulating layer 118 and the first bank 119a are disposed over the substrate 110 in the display area DA and the periphery area PA. The first insulating layer 118 includes the first opening 118h1 located in the periphery area PA. Also, the first bank 119a is spaced apart from the first opening 118h1 by a predetermined distance d1. The second bank 119b may be disposed in an opposite direction from which the first bank 119a is disposed, with respect to the first opening 118h1, and the second bank 119b may be spaced apart from the first opening 118h1 by a predetermined distance d2. For example, the first bank 119a and the second bank 119b might not be disposed in the first opening 118h1 and may be completely separated from each other.

A conductive layer 150 may be disposed at a top portion of the first insulating layer 118 and in the first opening 118h1, which are disposed in the periphery area PA. The conductive layer 150 may be disposed on the same layer as the first electrode 131. At least a part of the conductive layer 150 may be disposed between the first insulating layer 118 and the first bank 119a and between the first insulating layer 118 and the second bank 119b. The conductive layer 150 may be funned of the same material as that of the first electrode 131 and the conductive layer 150 may completely cover the first opening 118h1.

According to an exemplary embodiment of the present invention, the conductive layer 150 may include a plurality of third openings 150h3, each disposed in the periphery of the first opening 118h1. The first bank 119a may include a plurality of areas 119a1, 119a2, and 119a3, separated from one another, and disposed in the periphery area PA. The second bank 119b may also include a plurality of areas 119b1 and 119b2, separated from one another, and disposed in the periphery area PA. The plurality of areas 119a1, 119a2, 119a3, 119b 1 and 119b2 may be disposed to cover an edge of the conductive layer 150 including the plurality of third openings 150h3. The conductive layer 150 including the third openings 150h3 may have a mesh shape. For example, the plurality of areas 119a1, 119a2, 119a3, 119b1, and 119b2 of the first and second banks 119a and 119b are separated from one another, whereas conductive layers 150 might not be completely separated from one another, and may make some contact with each other via the third openings 150h3.

The third openings 150h3 in the conductive layer 150 may be disposed at a bottom portion of the conductive layer 150 and may serve as a path in which a gas generated from the first insulating layer 118, formed of an organic material, is dissipated to the outside. Thus, the quality of an image formed by the organic light-emitting display apparatus 1 may be prevented from being deteriorated, or deterioration may be reduced, by preventing the gas that is generated from the first insulating layer 118 from penetrating into the display area DA.

The second electrode 135 may be disposed over the first bank 119a. The second electrode 135 may contact the conductive layer 150 at spaces between the areas 119a1, 119a2, and 119a3 of the first bank 119a. The conductive layer 150 may be a power line for supplying power to the second electrode 135 or a connection line for connecting the power line for supplying power to the second electrode 135.

Referring to FIG. 1, the first opening 118h1 in the first insulating layer 118 may encompass the display area DA. For example, the first opening 118h1 may form a closed loop that completely surrounds the display area DA. Thus, the first insulating layer 118 may include a first area 118a and a second area 118b that are separated from each other by the first opening 118h1. The first area 118a and the first bank 119a may be disposed in the same direction with respect to the first opening 118h1, and the second area 118b and the second bank 119b may be disposed in the same direction with respect to the first opening 118h1. The second electrode 135 might only be disposed over the first bank 119a and might not be disposed in the first opening 118h1 or over the second bank 119b.

A capping layer 140 for increasing light efficiency of the organic light-emitting display apparatus 1 may be disposed over the second electrode 135. The capping layer 140 may be disposed within the display area DA and the periphery area PA and may be disposed only at a top portion of the second electrode 135, and might not extend beyond the second electrode 135. For example, at least a part of the second electrode 135 may be exposed by the capping layer 140. The capping layer 140 may be formed of an organic material. Although not shown in FIG. 3 an encapsulation layer (260 of FIG. 6) may be disposed over the capping layer 140, the encapsulation layer including at least one inorganic layer and at least one organic layer.

As described above, the first bank 119a and the second bank 119b may be disposed at opposite sides of the first opening 118h1. The distance d1, which extends from an edge of the first bank 119a facing the second bank 119b to the first opening 118h1, may be at least 4 μm. Similarly, the distance d2, which extends from an edge of the second bank 119b facing the first bank 119a to the first opening 118h1, may be at least 4 μm. The distances d1 and d2 may either be the same as or different from each other. Reference numeral 119VL of FIGS. 1 and 2 may represent a virtual line that connects edges of the plurality of areas 119a1, 119a2, and 119a3, included in the first bank 119a, and edges of the plurality of areas 119b1 and 119b2, included in the second bank 119b.

When each of the distances d1 and d2 is less than about 4 μm, the first bank 119a and/or the second bank 119b may flow into the first opening 118h1.

A width d3 of the first opening 118h1 may be 7 μm or more. For example, a distance between the first bank 119a and the second bank 119b may be about 15 μm or more. Through this configuration, the first bank 119a and the second bank 119b might not be connected to each other within the first opening 118h1.

Referring to FIG. 4, an organic light-emitting display apparatus 1' according to an example includes a second insulating layer 115' disposed within a periphery area and a first insulating layer 118' disposed over the second insulating layer 115'. The first insulating layer 118' includes a first opening 118h1'. A conductive layer 150' may be disposed in the first opening 118h1'. The conductive layer 150' may include third openings 150h3' formed in the periphery of the first opening 118h1'.

A first bank 119a' and a second bank 119b', which, together, cover at least a part of the conductive layer 150', may be disposed over the first insulating layer 118'. The first bank 119a'' and the second bank 119b' may be connected to each other within the first opening 118h1'. A second electrode 135' may be disposed over the first bank 119a'. The second electrode 135' may contact the conductive layer 150'.

Because each of the first bank 119a', the second bank 119b' and the first insulating layer 118' are formed of organic materials, impurities G1' and G2' (which may include gas and/or moisture introduced into the second bank 119b') which may be disposed outside of the first opening 118h1' or the first insulating layer 118', or may be generated from the second bank 119b' or the first insulating layer 118', may be introduced into the first bank 119a' via a connection part 119c' disposed within the first opening 118h1' along a path P' shown in FIG. 4. The impurities G1' and G2'' (which may include the gas and/or moisture) penetrating into the display area DA may penetrate into the intermediate layer 133 including the EML. Thus, the quality of an image formed in the organic light-emitting display apparatus 1' may be deteriorated.

Referring back to FIG. 3, the first bank 119a and the second bank 119b are separated from each other at opposing sides of the first opening 118h1. The first bank 119a, the first opening 118h1, the second bank 119b, and the first opening 118h1 may each be spaced apart from one another by the predetermined distance d1 or d2. The distances d1 and d1 may each be, for example, about 4 μm or more. Thus, in spite of a problem related to a process or characteristics of organic materials for forming the first and second banks 119a and 119b, the first and second banks 119a and 119b might not flow into the first opening 118h1.

Through this configuration, the impurity (e.g. gas and/or moisture) introduced into the second bank 119b or generated in the second bank 119b might not be introduced into the first bank 119a. Thus, the quality of the image formed in the organic light-emitting display apparatus 1 may be prevented from being deteriorated, or may reduce an extent of deterioration, by blocking the impurity from penetrating into the display area DA.

Figure 5:
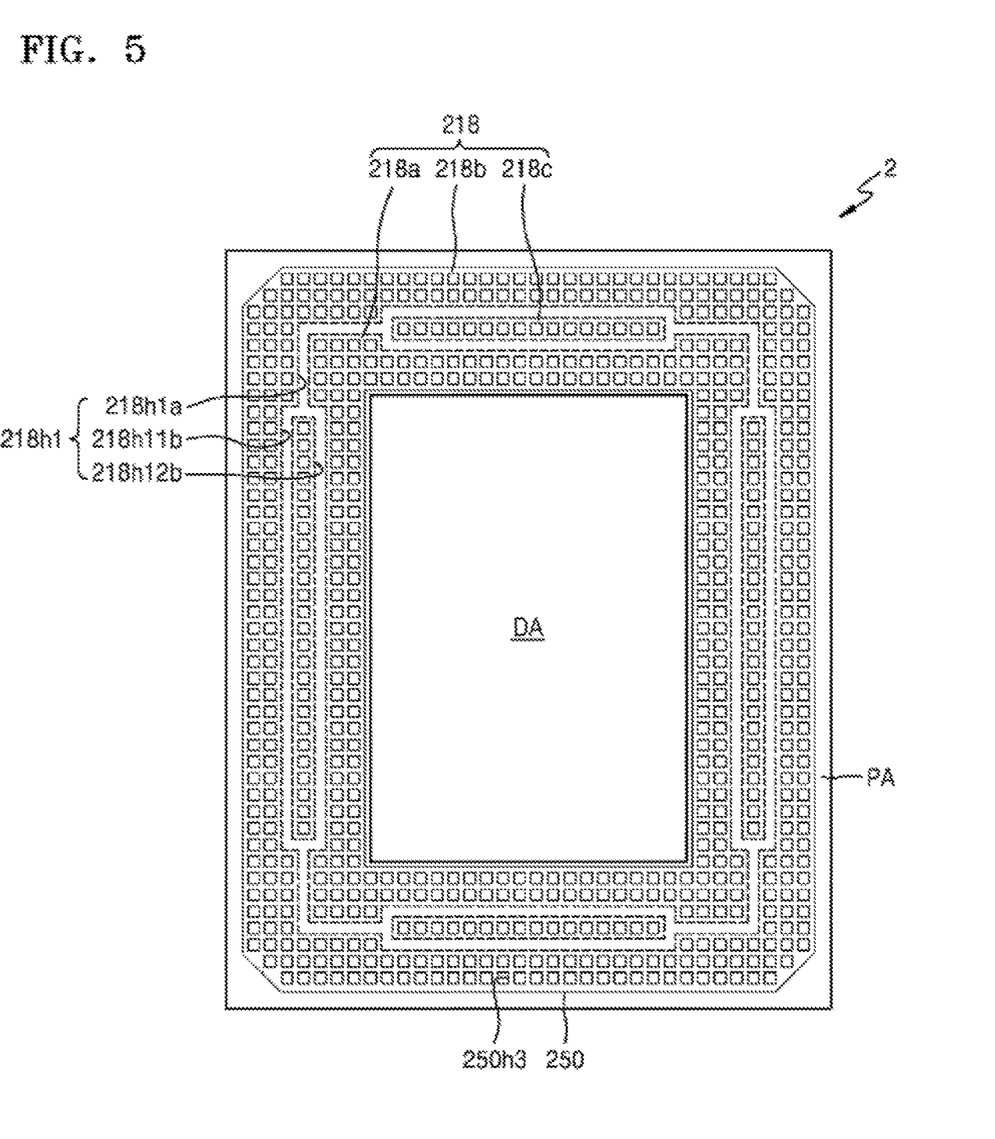
FIG. 5 is a plan view schematically illustrating a part of an organic light-emitting display apparatus according to an exemplary embodiment of the present invention.
Figure 6:
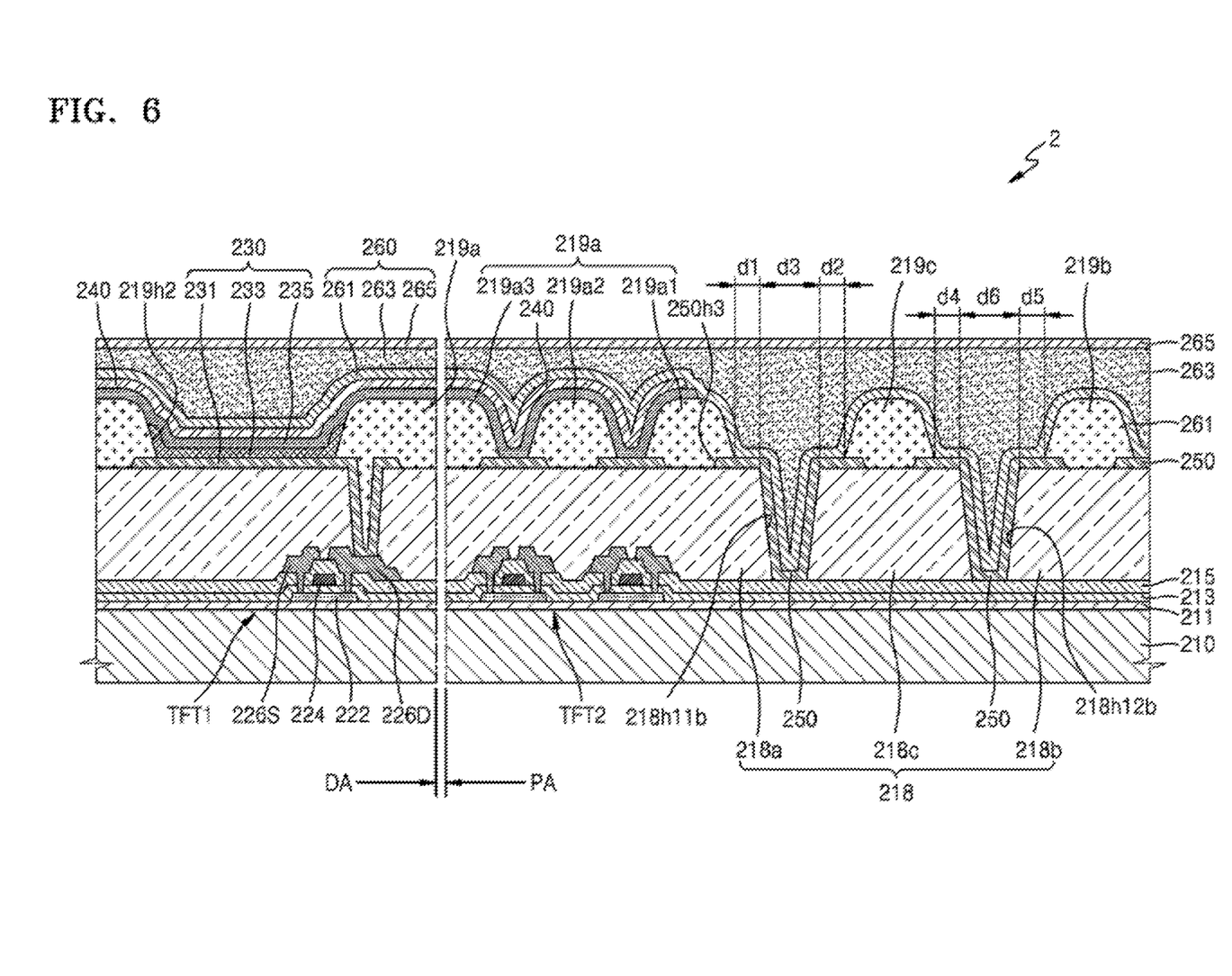
FIG. 6 is a cross-sectional view schematically illustrating a part of the organic light-emitting display apparatus of FIG. 5.

FIG. 5 is a plan view schematically illustrating a part of an organic light-emitting display apparatus according to an exemplary embodiment of the present invention, and FIG. 6 is a cross-sectional view schematically illustrating a part of the organic light-emitting display apparatus of FIG. 5.

Hereinafter, the difference between the organic light-emitting display apparatus 1 of FIG. 3 and an organic light-emitting display apparatus 2 of FIG. 6 will be described. FIG. 6 is a cross-sectional view illustrating a periphery area PA corresponding to an edge in which branched openings 218h11b and 218h12b of FIG. 5 are disposed.

Referring to FIGS. 5 and 6, the organic light-emitting display apparatus 2, according to an exemplary embodiment of the present invention, includes a substrate 210 having a display area DA and a periphery area PA that is located outside of the display area DA. A first insulating layer 218 is disposed in both the display area DA and the periphery area PA. The first insulating layer 218 is disposed over the substrate 210 and has a first opening 218h1 located in the periphery area PA. A first electrode 231 is disposed in the display area DA, over the first insulating layer 218. A first bank 219a is disposed over the first insulating layer 218 in both the display area DA and the periphery area PA. The first bank 219a includes a second opening 219h2, through which the center of the first electrode 231 is exposed. A second bank 219b is disposed over the first insulating layer 218 and is separated from the first bank 219a. The first opening 218h1 is disposed between the first bank 219a and the second bank 219b. An intermediate layer 233 is disposed over the first electrode 231. A second electrode 235 is disposed over the intermediate layer 233 and the first bank 219a.

The display area DA may include four corners and four edges which may connect the four corners. For example, the display area DA may have a rectangular shape. However, exemplary embodiments of the present invention are not limited thereto, and the display area DA may have a triangular shape or a polygonal shape such as a pentagonal shape or different polygonal shape.

A buffer layer 211 may be disposed over the substrate 210 and thin film transistors TFT1. OLEDs 230 are electrically connected to the thin film transistors TFT1. Each of the OLEDs 230 include the first electrode 231. The intermediate layer includes an EML. The second electrode 215 may be disposed in the display area DA over the buffer layer 211.

Each of the thin film transistors TFT1 may include a semiconductor layer 222, a gate electrode 224, a source electrode 226S, and a drain electrode 226D. A gate insulating layer 213 may be disposed between the semiconductor layer 222 and the gate electrode 224, and a second insulating layer 215 may be disposed over the gate electrode 224. The gate insulating layer 213 and the second insulating layer 215 may each include inorganic materials. The gate insulating layer 213 and the second insulating layer 215 may each be disposed within both the display area DA and the periphery area PA.

The first insulating layer 218 may be disposed over the thin film transistors TFT1 in the display area DA and the periphery area PA. The first insulating layer 218 may include the first opening 218h1, which is located in the periphery area PA and through which the second insulating layer 215 is exposed. The first opening 218h1 may encompass the display area DA and may form a closed loop.

The first opening 218h1 includes a main opening 218h1a and a plurality of branched openings 218h11b and 218h12b branched from the main opening 218h1a. The main opening 218h1a may be disposed adjacent to each of the four corners. Each of the branched openings 218h11b and 218h12b may be disposed at the four edges. However, exemplary embodiments of the present invention are not limited thereto, and the branched openings 218h11b and 218h12b may be located in at least two of the four edges.

Because the dead space of the periphery area PA corresponding to the corners of the display area DA is narrow, it may be difficult to form a plurality of openings in the first insulating layer 218. However, because the dead space of the periphery area PA corresponding to the edges of the display area DA is wide, a sufficiently large space in which a plurality of openings may be formed, may be secured. Thus, as illustrated in FIG. 5, one main opening 218h1a may be formed in the corners, and the plurality of branched openings 218h11b and 218h12b branched from the main opening 218h1a may be disposed in the edges so that an impurity may be prevented from being introduced into the display area DA.

The first insulating layer 218 may be divided by the first opening 218h1 into a first area 218a, a second area 218b, and a third area 218c. The third area 218c may be surrounded by the branched openings 218h11b and 218h12b. For example, the third area 218c may have an island shape. The first electrode 231 may be disposed in the display area DA over the first insulating layer 218, and a conductive layer 250 may be disposed in the periphery area PA. The conductive layer 250 may include a plurality of third openings 250h3. The plurality of third openings 250h3 may be located in the first area 218a, the second area 218b and the third area 218c of the first insulating layer 218.

The first bank 219a may be disposed over the first insulating layer 218 within both the display area DA and the periphery area PA. The second bank 219b may be disposed over the first insulating layer 218 in the periphery area PA. The first bank 219a includes a second opening 219h2 through which the center of the first electrode 231 is exposed. The first bank 219a may be divided into a plurality of areas 219a1, 219a2, and 219a3 in the periphery area PA. The second bank 219b may be separated from the first bank 219a. The branched openings 218b11b and 218h12b are disposed between the first bank 219a and the second bank 219b. The third bank 219c may be separated from both the first bank 219a and the second bank 219b, between the plurality of branched openings 218h11b and 218h12b. For example, the first bank 219a, the second bank 219b, and the third bank 219c may each be disposed in a first area 218a, a second area 218b, and a third area 218c of the first insulating layer 218, respectively. Each of a distance d1 (from an edge of the first bank 219a to the branched opening 218h11b) and a distance d2 (from an edge of the third bank 219c to the branched opening 218h11b) may be about 4 μm or more so that the first through third banks 219a, 219b and 219c may be completely separated from one another. A width d3 of the branched opening 218h11b may be about 7 μm or more. For example, a distance between the first bank 219a and the third bank 219c may be about 15 μm or more.

Similarly, each of a distance d4 (from an edge of the third bank 219c to the branched opening 218h12b) and a distance d5 (from an edge of the second bank 219b to the branched opening 218b12b) may be about 4 μm or more. A width d6 of the branched opening 218h12b may be about 7 μm or more. For example, a distance between the second bank 219b and the third bank 219c may be about 15 μm or more.

The first bank 219a, the second bank 219b, and the third bank 219c may cover at least a part of the conductive layer 250 in the periphery area PA and might not be disposed in the branched openings 218h11b and 218h12b. The conductive layer 250 may include a plurality of third openings 250h3.

The intermediate layer 233 including an EML may be disposed over the first electrode 231. The second electrode 235 may be disposed over the intermediate layer 233. The second electrode 235 may be disposed at a top portion of the intermediate layer 233 and a top portion of the first bank 219a. The second electrode 235 might not be disposed in the first opening 218h1 and might not be disposed at a top portion of the second bank 219b or a top portion of the third bank 219c. The second electrode 235 may contact the conductive layer 250 in regions between the plurality of areas 219a1, 219a2, and 219a3 of the first bank 219a. The conductive layer 250 may be a power line for supplying power to the second electrode 235 or a connection line for connecting the power line for supplying power to the second electrode 235.

A capping layer 240 for increasing light efficiency of the organic light-emitting display apparatus 2 and including an organic material may be disposed over the second electrode 235. An encapsulation layer 260 covers the OLED 230 and protects the OLED 230 from moisture or oxygen from the outside. The encapsulation layer 260 may be disposed over the capping layer 240. The encapsulation layer 260 may cover the display area DA and may extend up to the periphery area PA. The encapsulation layer 260 may include a first inorganic layer 261, an organic layer 263, and a second inorganic layer 265, as illustrated in FIG. 6.

The first inorganic layer 261 may cover the capping layer 240 and may include a silicon oxide, a silicon nitride and/or a silicon oxynitride. Other layers including an LiF layer may be disposed between the first inorganic layer 261 and the capping layer 240, as needed. Because the first inorganic layer 261 is formed along a lower structure, a top surface of the first inorganic layer 261 might not be flat, as illustrated in FIG. 6. The organic layer 263 may cover the first inorganic layer 261, and a top surface of the organic layer 263 may be substantially flat. The organic layer 263 may include polyethylene terephthalate (PET), polyethylene naphthalate (PEN), poly carbonite (PC), polymide (PI), polyethylene sulfonate, polyoxymethylene, polyarylates (PAR), and hexamethyldisiloxane. The second inorganic layer 265 may cover the organic layer 263 and my include a silicon oxide, a silicon nitride and/or a silicon oxynitride. Although not shown, the second inorganic layer 265 may contact the first inorganic layer 261 in an edge region of the organic light-emitting display apparatus 2 so as to protect the organic layer 263 from exposure to the outside.

In this way, the encapsulation layer 260 includes the first inorganic layer 261, the organic layer 263, and the second inorganic layer 265. Thus, through this multi-layered structure, even thought cracks occur in the encapsulation layer 260, these cracks might not be connected between the first inorganic layer 261 and the organic layer 263 or between the organic layer 263 and the second inorganic layer 265. Thus, a path in which moisture or oxygen from the outside penetrates into the display area DA, may be prevented from being formed, or formation thereof may be reduced.

Figure 7:
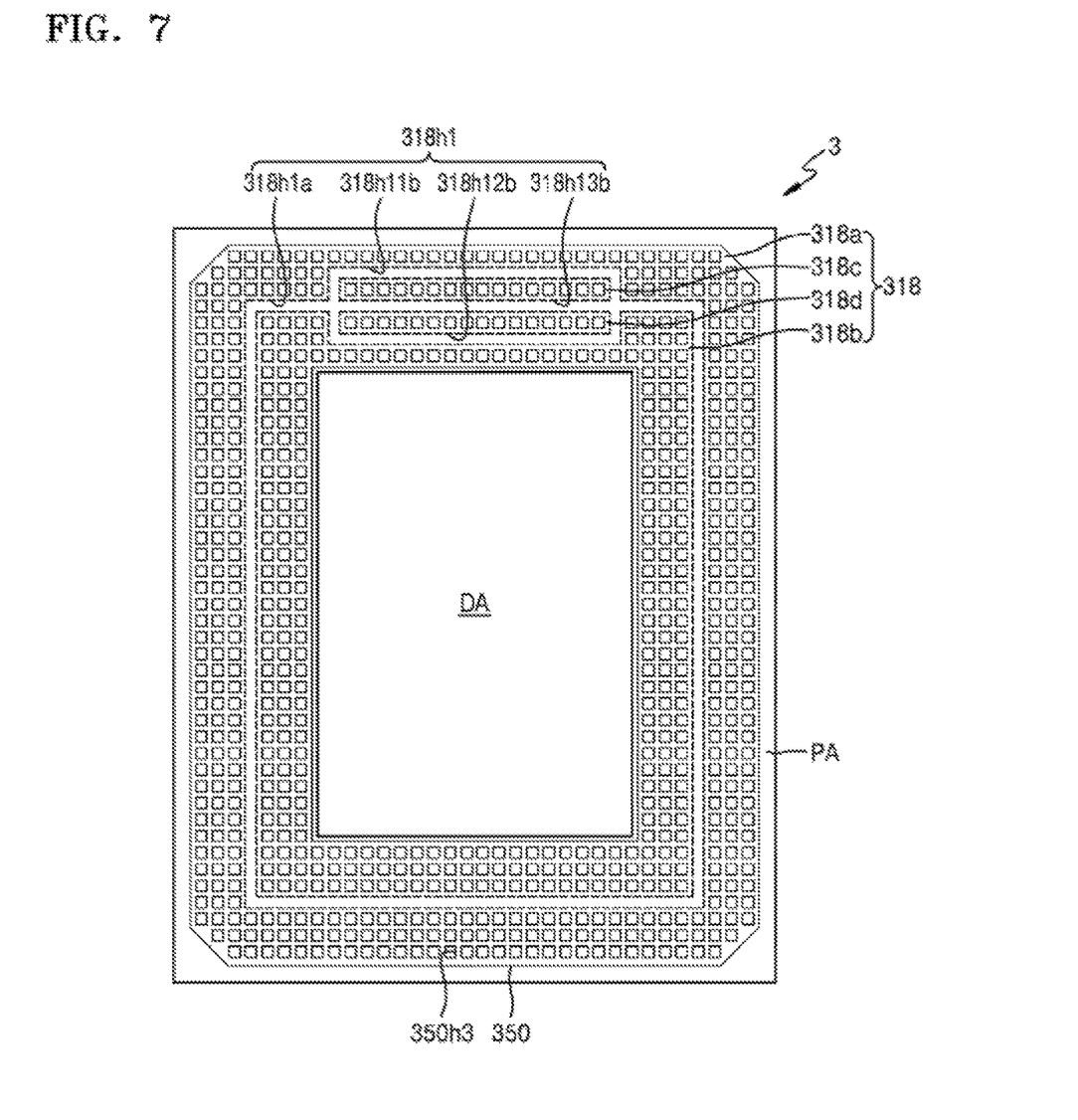
FIG. 7 is a cross-sectional view schematically illustrating a part of an organic light-emitting display apparatus according to an exemplary embodiment of the present invention.

FIG. 7 is a cross-sectional view schematically illustrating a part of an organic light-emitting display apparatus 3 according to an exemplary embodiment of the present invention. Because the remaining configurations of the organic light-emitting display apparatus 3 of FIG. 7 except for a first insulating layer 318 and a conductive layer 350 may be substantially the same as those of the organic light-emitting display apparatus 1 of FIG. 3 or the organic light-emitting display apparatus 2 of FIG. 6, hereinafter, only the first insulating layer 318 and the conductive layer 350 will be described, and it is to be assumed that all other elements not described herein are substantially the same as corresponding elements descried with reference to FIG. 3 or 6.

Referring to FIG. 7, the organic light-emitting display apparatus 3 according to an exemplary embodiment of the present invention includes the first insulating layer 318 disposed in the display area DA and the periphery area PA. The first insulating layer 318 may include a first opening 318h1 located in the periphery area PA. The first opening 318h1 may surround the display area DA and may include a main opening 318h1a disposed in the periphery area PA corresponding to a corner of the display area DA and three branched openings 318h11b, 318h12b, and 318h13b disposed in the periphery area PA corresponding to an edge of the display area DA and branched from the main opening 318h1a.

In FIG. 7, the three branched openings 318h11b, 318h12b, and 318h13b are located in one edge of the display area DA. However, embodiments are not limited thereto. For example, the three branched openings 318h11b, 318h12b, and 318h13b may be located in two or more edges. The first insulating layer 318 may be divided by the three branched openings 318h11b, 318h12b, and 318h13b into a first area 318a, a second area 318b, a third area 318c, and a fourth area 318d, which are separated from one another. The third area 318c and the fourth area 318d may be surrounded by the branched openings 318h11b, 318h12b, and 318h13b. For example, each of the third area 318c and the fourth area 318d may have an island shape.

In the organic light-emitting display apparatus 3 of FIG. 7, the three branched openings 318h11b, 318h12b, and 318h13b are disposed in one edge of the display area DA. Thus, gas or moisture introduced from the outside or generated from layers disposed outside the first opening 318h1 and formed of organic materials may be more effectively blocked so that the quality of an image formed in the organic light-emitting display apparatus 5 may be prevented from being deteriorated or determination may be reduced.

In the organic light-emitting display apparatuses 1, 2, and 3 according to the above-described embodiments, the first insulating layers 118, 218, and 318 including the first openings 118h1, 218h1, and 318h1 are disposed in the periphery area PA, and an introduction path of impurities that may be introduced into the first openings 118h1, 218h1, and 318h1 from outside of the first openings 118h1, 218h1, and 318h1 may be effectively blocked so that the quality of an image formed in each of the organic light-emitting display apparatuses 1, 2, and 3 may be prevented from being deteriorated or deterioration ma be reduced.

As described above, according to the one or more exemplary embodiments of the present invention, an organic light-emitting display apparatus may prevent the quality of an image from being deteriorated, or may reduce an extent to which quality is deteriorated, as a result of contamination that might occur during a manufacturing process or in subsequent use.

While exemplary embodiments of the present invention have been described above with reference to the figures, it will be understood by those of ordinary skill in the art that various changes in form and details may be made therein without departing from the spirit and scope of the invention.

What is claimed is:

1. An organic light-emitting display apparatus, comprising:
    a substrate including a display area and a non-display area surrounding the display area;
    a first bank disposed on the substrate and having a plurality of openings that correspond to a plurality of sub-pixels;
    a second bank separated from the first bank and disposed within the non-display area; and
    an insulating layer disposed under the first bank and the second bank and having an opening disposed between the first bank and the second bank such that the opening of the insulating layer separates a first portion of the insulating layer that is disposed under the first bank from a second portion of the insulating layer that is disposed under the second bank,
    wherein there are no openings disposed in the insulating layer between the sub-pixels of the plurality of sub-pixels.

2. The organic light-emitting display apparatus of claim 1, further comprising a conductive layer disposed over the insulating layer and covering the opening that is disposed between the first bank and the second bank, the conductive layer being at least partially exposed within the non-display area.

3. The organic light-emitting display apparatus of claim 1, wherein the first bank and the second bank include a same organic material as the insulating layer.

4. The organic light-emitting display apparatus of claim 1, further including a first electrode disposed within the display area and overlapping the insulation layer therein.

5. The organic light-emitting display apparatus of claim 4, wherein a center of the first electrode is exposed through an opening in the first bank.

6. The organic light-emitting display apparatus of claim 1, further including an intermediate layer, disposed over the first electrode, and a second electrode, the second electrode disposed over the intermediate layer and the first bank.

7. The organic light-emitting display apparatus of claim 6, further comprising a capping layer disposed over the second electrode within the display area and the non-display area, the capping layer not overlapping the opening that is disposed between the first bank and the second bank.

* * * * *